United States Patent
Kochi

(10) Patent No.: US 7,566,857 B2
(45) Date of Patent: Jul. 28, 2009

(54) IMAGE SENSOR, MULTI-CHIP MODULE TYPE IMAGE SENSOR AND CONTACT IMAGE SENSOR

(75) Inventor: Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/326,973

(22) Filed: Dec. 3, 2008

(65) Prior Publication Data

US 2009/0101799 A1      Apr. 23, 2009

Related U.S. Application Data

(62) Division of application No. 11/968,790, filed on Jan. 3, 2008, now Pat. No. 7,473,882, which is a division of application No. 11/348,317, filed on Feb. 7, 2006, now Pat. No. 7,335,869.

(30) Foreign Application Priority Data

Mar. 1, 2005    (JP)    .............................. 2005-056018

(51) Int. Cl.
*H01L 27/00*    (2006.01)

(52) U.S. Cl. ..................... 250/208.1; 250/226; 348/272; 257/440

(58) Field of Classification Search ............. 250/208.1, 250/214.1, 226; 257/432, 440, 443; 348/272, 348/280, 294, 302, 308; 356/402, 406, 419
See application file for complete search history.

(56) References Cited

U.S. PATENT DOCUMENTS

| | | | |
|---|---|---|---|
| 5,691,760 A | 11/1997 | Hosier et al. ................. 347/238 |
| 5,801,373 A | 9/1998 | Oozu et al. ............... 250/208.1 |
| 6,150,704 A | 11/2000 | Kozuka ....................... 257/434 |
| 6,188,094 B1 | 2/2001 | Kochi et al. .................. 257/232 |
| 6,605,850 B1 | 8/2003 | Kochi et al. .................. 257/431 |
| 6,670,990 B1 | 12/2003 | Kochi et al. .................. 348/310 |
| 6,717,151 B2 | 4/2004 | Tashiro et al. .......... 250/370.11 |
| 6,800,836 B2 | 10/2004 | Hamamoto et al. ....... 250/208.1 |

(Continued)

FOREIGN PATENT DOCUMENTS

JP       3-289856 A       12/1991

(Continued)

*Primary Examiner*—Kevin Pyo
(74) *Attorney, Agent, or Firm*—Fitzpatrick, Cella, Harper & Scinto

(57) ABSTRACT

The invention is to suppress a loss in image quality resulting from a sensitivity difference among different colors and to suppress an increase in a chip area. The invention provides for example an image sensor including three light detecting element rows respectively having R, G and B color filters on light detecting apertures, in which the light detecting element in the G light detecting element row has a light detecting area larger than that of the light detecting element in other B and R light detecting element rows and centers of gravity of light detecting parts of the light detecting elements in the respective light detecting element rows are arranged with a constant pitch (pitch Q) among the light detecting element rows and in which the G light detecting element row with a larger light detecting area in the light detecting element is not positioned as an end row among the R, G and B light detecting element rows but as a central light detecting element row.

2 Claims, 8 Drawing Sheets

U.S. PATENT DOCUMENTS

| | | |
|---|---|---|
| 6,946,637 B2 | 9/2005 | Kochi et al. .............. 250/208.1 |
| 7,016,089 B2 | 3/2006 | Yoneda et al. .............. 358/482 |
| 7,110,030 B1 | 9/2006 | Kochi et al. ................. 348/308 |
| 7,129,458 B2 | 10/2006 | Hamamoto et al. ...... 250/208.1 |
| 7,135,668 B2 | 11/2006 | Kochi et al. ............. 250/214 R |
| 7,221,397 B1 | 5/2007 | Kochi ......................... 348/310 |
| 7,335,869 B2 | 2/2008 | Kochi ..................... 250/208.1 |
| 7,473,882 B2 * | 1/2009 | Kochi ..................... 250/208.1 |
| 2005/0185074 A1 | 8/2005 | Yoneda et al. .............. 348/294 |
| 2005/0206763 A1 | 9/2005 | Kochi et al. ................. 348/302 |
| 2006/0169871 A1 | 8/2006 | Kochi ...................... 250/208.1 |
| 2007/0165125 A1 | 7/2007 | Kochi ......................... 348/300 |

FOREIGN PATENT DOCUMENTS

| | | |
|---|---|---|
| JP | 11-112006 A | 4/1999 |
| JP | 11-150627 A | 6/1999 |

* cited by examiner

IMAGE SENSOR, MULTI-CHIP MODULE TYPE IMAGE SENSOR AND CONTACT IMAGE SENSOR

CROSS REFERENCE TO RELATED APPLICATIONS

The present application is a division of U.S. application Ser. No. 11/968,790, filed on Jan. 3, 2008 now U.S. Pat. No. 7,473,882, which is a division of U.S. application Ser. No. 11/348,317, filed on Feb. 7, 2006, which issued as U.S. Pat. No. 7,335,869 on Feb. 26, 2008. The entire disclosures of these earlier related applications are incorporated by reference herein.

BACKGROUND OF THE INVENTION

1. Field of the Invention

The present invention relates to a photoelectric conversion device, and more particularly to an image sensor having a photoelectric conversion element and a color filter provided in a light detecting part thereof, on a substrate.

The present invention further relates to a multi-chip module type image sensor, a contact image sensor and an image reading apparatus, formed by arranging such image sensor by plural units in an array.

2. Related Background Art

As a line-type image reading device in the field of information processing system, instead of the prior reduction-type line sensor utilizing an optical system, developments are being made for an equal-size contact image sensor formed by mounting multiple semiconductor photosensors.

Also a color sensor is being recently desired instead of the prior monochromatic sensor.

For example, Japanese Patent Application Laid-open No. H03-289856 discloses a structure of such sensor. FIGS. 14 to 16 are equivalent circuit diagrams of an image sensor described in the above-mentioned patent reference. More specifically, FIG. 14 is a schematic view of a semiconductor image sensor of multi chip module type; FIG. 15 is a magnified view of a part A of the multi-chip module type semiconductor image sensor; and FIG. 16 is a view showing a configuration of an optical system utilizing the multi-chip module type semiconductor image sensor.

In FIGS. 14 and 16, there are shown an original 1, a circuit board 2 having desired circuits for mounting semiconductor image sensor, semiconductor image sensors S1 to Sn arranged in a linear array, a Celfoc lens array (trade name of Nippon Plate Glass Co.), and an original illuminating LED array 4. Also a combination of an LED and a light conducting member is often employed instead of the original illuminating LED array 4.

In FIG. 15, 5 indicates a light detecting aperture on the semiconductor image sensor. In case of a color sensor, the light detecting aperture 5 on the semiconductor image sensor is provided in three rows, which are respectively provided with red, green and blue color filters as shown in FIG. 15. The light detecting apertures of red, blue and green in a same column have respective outputs to constitute a color light detecting element. In order to facilitate formation of a color signal from the red, blue and green signals in a subsequent image processing, a pitch Q of the rows (a distance between centers of gravity of the light detecting apertures in a sub scanning direction) is selected same as or an integral multiple of a pitch P of the light detecting apertures in the main scanning direction. FIG. 15 shows a case where the row pitch Q is twice of the pitch P of the light detecting apertures in the main scanning direction (Q=2 P).

A peripheral circuit block 6 is provided on the semiconductor image sensor for controlling and outputting a photosignal, generated from the light received by the light detecting aperture.

Such semiconductor image sensor of multi chip module type has a feature capable of dispensing with a reduction optical system thereby enabling compactification, and is widely employed in an image processing apparatus such as a facsimile apparatus or a scanner.

However, in case the light detecting apertures in different rows having a same area as shown in FIG. 15, since the sensitivity is different for the respective colors depending on the light emission characteristics of LED, the spectral characteristics of the color filters and the spectral characteristics of the light detecting element, the image quality is determined by an output of a row corresponding to a color of lowest sensitivity.

In order to avoid such drawback, Japanese Patent Application Laid-open No. H11-150627 discloses changing the light detecting area of the pixel according to the transmittance of the color filter.

However the present inventor has found another drawback, in case of changing the light detecting area of the pixel, depending on the row of pixels (light detecting element row) in which the light detecting area is changed.

SUMMARY OF THE INVENTION

An object of the present invention is to provide an image sensor, a multi-chip module type image sensor and a contact sensor, in which an area of a light detecting aperture is regulated (increased or decreased) according to a sensitivity in order to solve or alleviate the aforementioned drawback, and which can also solve another drawback resulting from a regulation in the area of the light detecting aperture.

The present invention provides an image sensor including at least three light detecting element rows each having plural light detecting elements and a color filter provided on each light detecting element, in which the light detecting element in one light detecting element row has a light detecting area larger than that of the light detecting element in the other light detecting element rows, and the light detecting element rows are arranged such that gravities of light detecting parts of the light detecting elements of the respective light detecting element rows are arranged at a constant pitch:

wherein the light detecting element row with a larger light detecting area in the light detecting element is positioned between the aforementioned other light detecting element rows.

The present invention also provides an image sensor including at least three light detecting element rows each having plural light detecting elements and a color filter provided on each light detecting element, in which the light detecting element of at least one light detecting element row has a light detecting area larger than that of the light detecting element in the other at least two light detecting element rows, and the light detecting element rows are arranged such that centers of gravity of light detecting parts of the light detecting elements of the respective light detecting element rows are arranged at a constant pitch:

wherein the at least one light detecting element row with a larger light detecting area of the light detecting element is positioned between the aforementioned other light detecting element rows with a smaller light detecting area of the light detecting elements.

The foregoing expression "the at least one light detecting element row with a larger light detecting area in the light detecting element is positioned between the aforementioned other light detecting element rows" has a following meaning. For the light detecting element rows in which the light detecting elements thereof have light detecting areas S1, S2 and S3, in case of S1>S2≧S3, the foregoing expression means that the light detecting element row in which the light detecting elements thereof have a light detecting area S1 is not positioned in the rows on both ends. Also for the light detecting element rows in which the light detecting elements thereof have light detecting areas S1, S2, S3 and S4, in case of S1≧S2>S3≧S4, the foregoing expression means that the light detecting element row in which the light detecting elements thereof have a light detecting area S1 or S2 is not positioned in the rows on both ends.

The present invention also provides an image sensor including at least three light detecting element rows each having plural light detecting elements and a color filter provided on each light detecting element, and a peripheral circuit unit for controlling and outputting a photo signal generated by the light detecting elements of the at least three light detecting element rows, in which the light detecting element of one light detecting element row among the at least three light detecting element rows has a light detecting area smaller than that in the light detecting element of other light detecting element rows, and the light detecting element rows are arranged such that centers of gravity of light detecting parts of the light detecting elements of the respective light detecting element rows are arranged at a constant pitch:

wherein the light detecting element row with a smaller light detecting area in the light detecting element is positioned, among the at least three light detecting element rows, in an end row at the side of the peripheral circuit unit.

The present invention also provides an image sensor including plural light detecting element rows each having plural light detecting elements and a color filter provided on each light detecting element, in which centers of gravity of light detecting parts of the light detecting elements of the respective light detecting element rows are arranged at a constant pitch among the light detecting element rows:

wherein a driving circuit part for reading an electrical signal from each light detecting element is provided for each light detecting element; and wherein a pitch L of the light detecting elements along a direction of array thereof in the plural light detecting element rows, a pitch nL (n being a positive integer) of the plural light detecting element rows along a direction of arrangement thereof, a width k of the driving circuit part in the direction of arrangement of the plural light detecting element rows, a width a of a first light detecting aperture with a largest area among the plural light detecting element rows along the direction of arrangement of the plural light detecting element rows, and a width b of a second light detecting aperture with a second largest area among the plural light detecting element rows along the direction of arrangement of the plural light detecting element rows are selected that the width a meets a following relation:

$(a/2)+k+(b/2)=nL$

The expression "width a meets a following relation" includes also a situation where the width a is close to the relation $(a/2)+k+(b/2)=nL$. More specifically, the width a may be selected smaller than a value defined by the aforementioned relation, in consideration for example of a fluctuation in the manufacture, and such situation is also considered in the present invention that "the width a is selected to meet the relation".

The present invention allows to suppress a loss in the image quality resulting from a sensitivity difference among the colors and to suppress an increase in the chip area.

Also the present invention allows to suppress a photocarrier generation by the light of an unnecessary wavelength region, thereby suppressing a color mixing and providing a color image of a high quality.

DETAILED DESCRIPTION OF THE PREFERRED EMBODIMENTS

In the following, embodiments of the present invention will be explained in detail with reference to the accompanying drawings.

First Embodiment

A configuration of the present invention will be explained while making comparison with a prior example.

Figure 10:
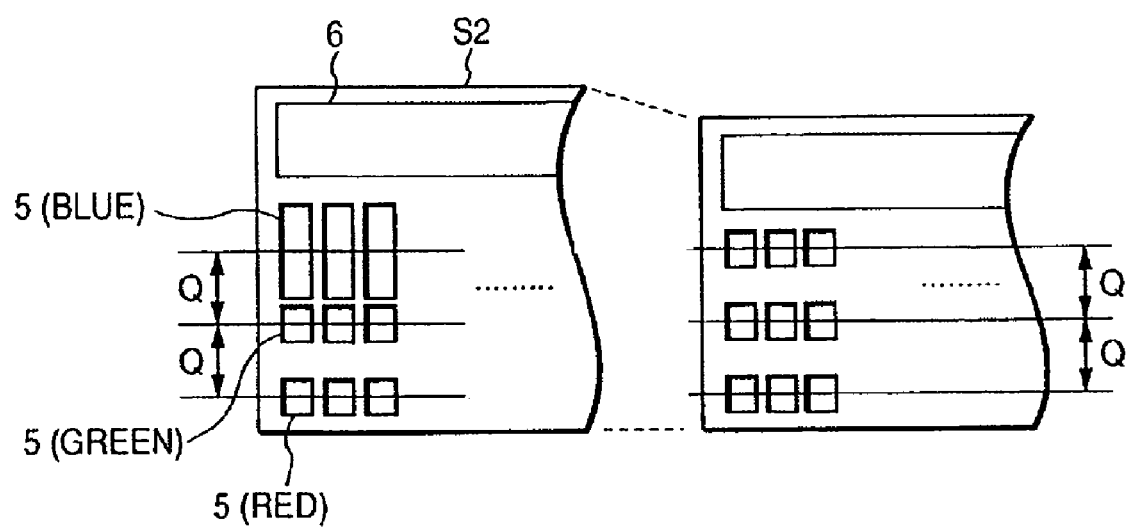
FIG. 10 is a schematic plan view of a semiconductor image sensor in a comparative example.

In case of increasing the area of the light detecting aperture in the light detecting element row, since a pitch P in the main scanning direction is determined by specifications of the image sensor, the area is spread in the sub scanning direction thereby improving the sensitivity. FIG. 10 shows a comparative example in which the area is spread in a light detecting aperture 5 (blue) present in the vicinity of a peripheral circuit block, in comparison with a part of FIG. 15. With a row pitch Q selected equal to or as an integral multiple of the pitch P of the light detecting apertures in the main scanning direction, the position of the peripheral circuit block 6 has to be rearranged corresponding to the spreading of area. As a result, the semiconductor image sensor becomes larger in the chip area, thereby resulting in an increase in the chip cost.

Figure 11:
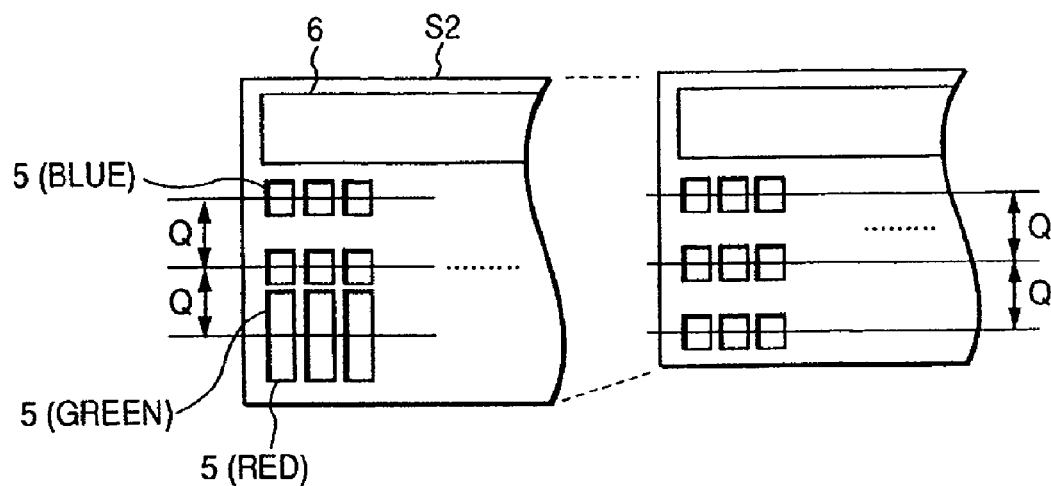
FIG. 11 is a schematic plan view of a semiconductor image sensor in another comparative example.
Figure 15:
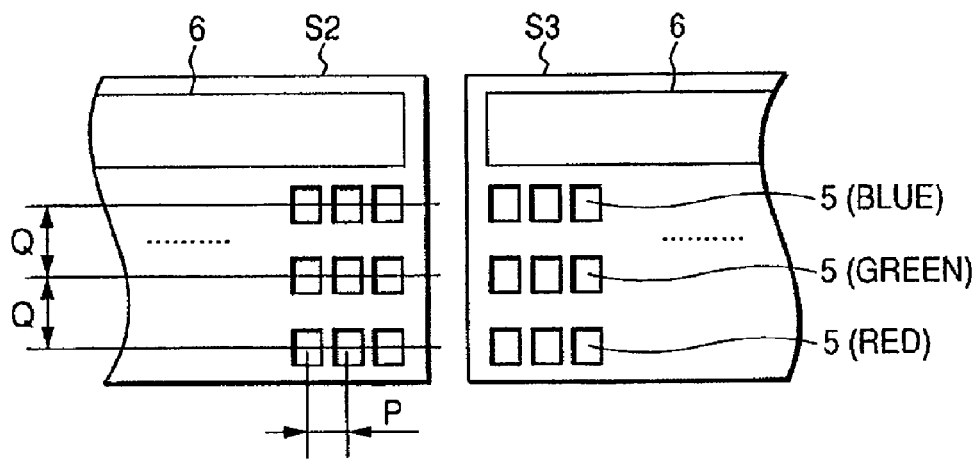
FIG. 15 is a magnified view of a part A in FIG. 14.

FIG. 11 shows a comparative example, in which a row with a widened area is positioned close to a chip end of the semiconductor image sensor, in comparison with a part of FIG. 15. As shown in FIG. 11, a row pitch Q is selected equal to or as an integral multiple of the pitch P of the light detecting apertures in the main scanning direction, as in the case of FIG. 10. In such case, the chip end position has to be changed corresponding to the spreading of area. As a result, the semiconductor image sensor becomes larger in the chip area, thereby resulting in an increase in the chip cost.

Figure 1:
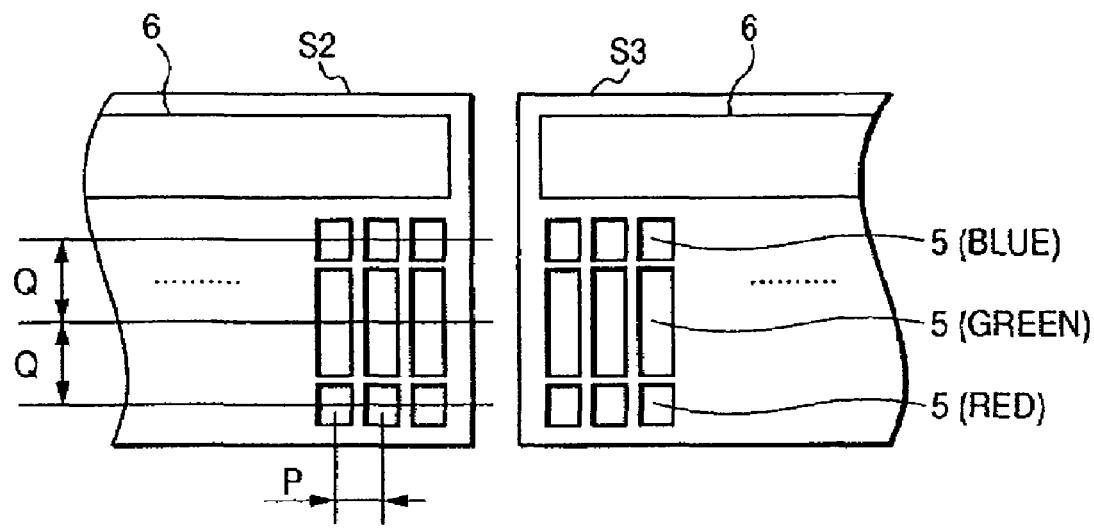
FIG. 1 is a schematic plan view of a first embodiment of a photoelectric converting device of the present invention.
Figure 14:
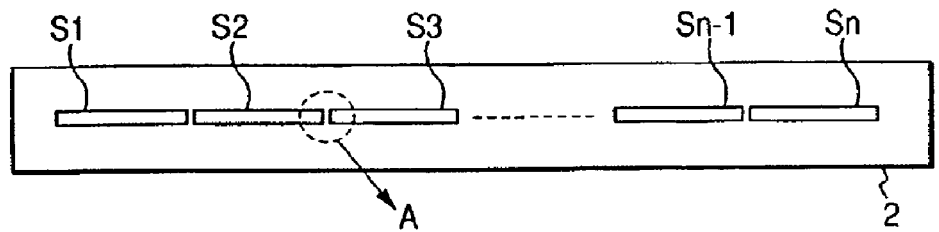
FIG. 14 is a schematic plan view of a multi-chip module type sensor in a prior technology.
Figure 16:
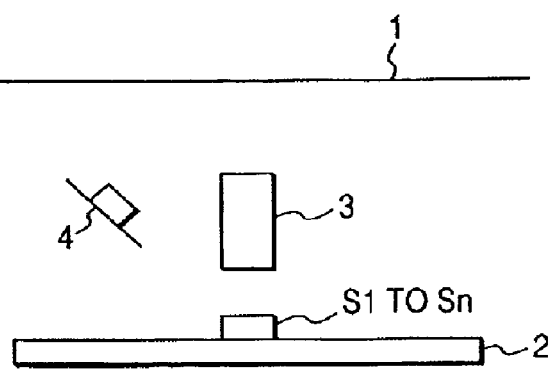
FIG. 16 is a view showing an optical system utilizing the multi-chip module type image sensor shown in FIG. 14.

FIG. 1 is a schematic plan view showing a configuration of a first embodiment of the present invention, and is a magnified view of a boundary portion between two adjacent semiconductor image sensors. The structure of a multi-chip module type semiconductor image sensor will not be explained further, as it is already explained with reference to FIGS. 14 to 16. FIG. 1 shows a case where the row pitch Q is selected twice of the pitch P of the light detecting apertures in the main scanning direction (Q=2P).

In the present embodiment, a row with a widened area is positioned at the center of three rows, as shown in FIG. 1. Such configuration allows to retain the advantage of selecting the row pitch Q equal to or as an integral multiple of the pitch P of the light detecting apertures in the main scanning direction thereby facilitating formation of the color signal, and also to resolve or alleviate the drawback of image quality loss resulting from a sensitivity difference between the colors.

In case of selecting the row pitch Q (distance of centers of gravity of the light detecting apertures in the sub scanning direction) equal to the pitch P of the light detecting apertures in the main scanning direction, because of the restriction in the row pitch Q (Q=P), the area spreading of the light detecting aperture in the pixels of the center row is limited. However, the row pitch can be made larger by selecting, as in the present embodiment, each row pitch Q as an integral multiple of the pitch P of the light detecting apertures in the main scanning direction (Q=2P, 3P, . . . ). As a result, the length of the light detecting aperture may be made arbitrarily longer in the sub scanning direction, thereby increasing the area.

As already explained, the area of the light detecting apertures is determined according to the light emission characteristics of the light source, the spectral characteristics of the color filter and the spectral characteristics of the light detecting element. In the present embodiment, the area of the light detecting aperture is made larger in the green row, which is positioned at the center. However, in case a light detecting element row showing a lower sensitivity at a same area of the light detecting aperture is a red or blue row, the area of the light detecting aperture may be made larger in such red or blue row, which may be positioned at the center.

Second Embodiment

In the following, the configuration of the present embodiment will be explained.

The present embodiment shows a case where the areas of the light detecting apertures are made all different among the three light detecting element rows, in which the light detecting aperture with a smallest area is made smaller than in the case shown in FIG. 15. Also in the present embodiment, a row having the light detecting aperture of a largest area is positioned at the center, as in the first embodiment.

Figure 2:
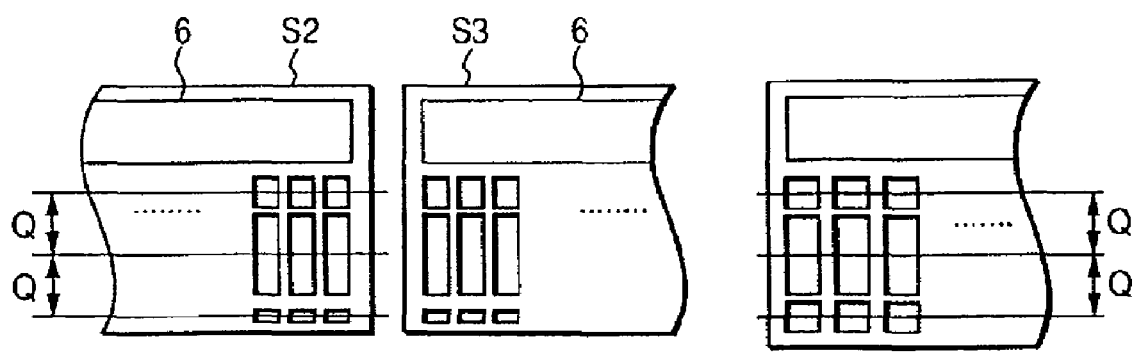
FIG. 2 is a schematic plan view of a second embodiment of the photoelectric converting device of the present invention.
Figure 3:
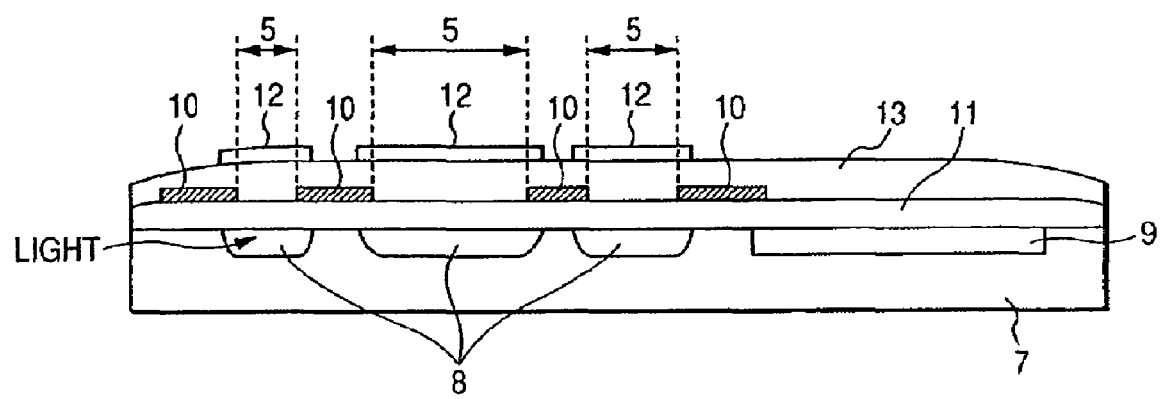
FIG. 3 is a schematic cross-sectional view of the second embodiment of the photoelectric converting device of the present invention.

FIG. 2 shows the configuration of the present embodiment, in which the light detecting aperture of the smallest area is positioned at a chip end of the semiconductor image sensor. FIG. 3 is a schematic cross-sectional view of the semiconductor image sensor shown in FIG. 2, wherein shown are a semiconductor substrate 7, a light detecting element 8 such as a photodiode, a semiconductor device area 9 for forming a peripheral circuit block 6, and a light shielding layer 10 formed on an interlayer film 11. A light detecting aperture 5 is defined by an aperture position in the light shielding layer. A color filter 12 is formed on a passivation film 13.

Thus the present embodiment has advantages similar to those of the first embodiment.

However, the configuration shown in FIG. 2 may have a following drawback.

Figure 4:
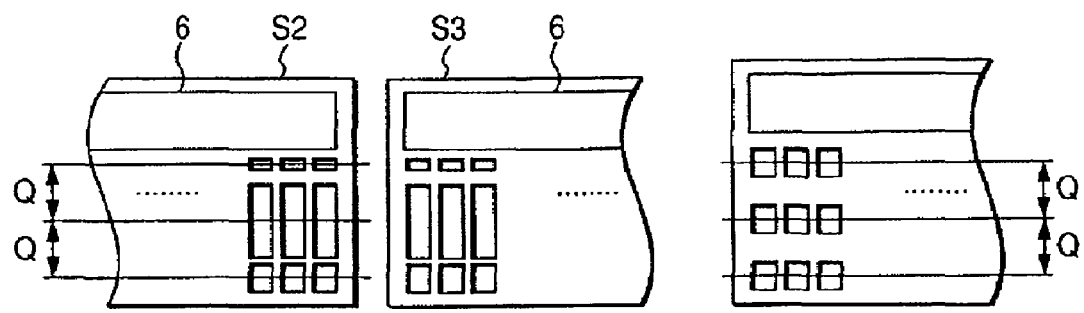
FIG. 4 is a schematic cross-sectional view of another second embodiment of the photoelectric converting device of the present invention.

A chip end portion, generally involving changes in a pattern density or in a layer configuration as shown in FIG. 3, tends to result in a fluctuation in the thickness of the interlayer film and the passivation film. As a result, a ripple in the spectral characteristics, resulting from multiple reflections caused by a difference in the refractive indexes between the interlayer film and the passivation film, becomes different by the difference in the thickness of the passivation film. Therefore, the spectral characteristics of the light detecting element may be different between an end portion and a central portion of a chip. In case a row with the light detecting aperture of the smallest area is positioned in a chip end portion as shown in FIGS. 2 and 3, a part showing a film thickness fluctuation represents a larger ratio with respect to a part with a constant film thickness and may exert a significant influence, thereby deteriorating the image quality. Also a chip end portion tends to receive a stray light from an end face. In FIG. 4, "Light" indicates a stray light from the end face. Such stray light from the end face, not filtered by the color filter, may cause a color mixing. Thus, the arrangement of the row of the smallest area of the light detecting aperture at the chip end portion may include a color mixing and may deteriorate the image quality.

FIG. 4 is a schematic plan view showing another configuration of the second embodiment of the present invention, and is a magnified view showing a boundary area of two adjacent semiconductor image sensors. The structure of a multi-chip module type semiconductor image sensor will not be explained further, as it is already explained with reference to FIGS. 14 to 16.

FIG. 4 shows, as in FIG. 2, a case where the areas of the light detecting apertures are made all different among the three light detecting element rows, but it is different from the configuration shown in FIG. 2 in that the row having the light detecting aperture of the smallest area is positioned in the vicinity of the peripheral circuit block.

The embodiment shown in FIG. 4, in addition to the effects of the first embodiment, can solve or alleviate the drawback of the configuration shown in FIG. 2 while maintaining a constant row pitch Q, thereby providing a satisfactory image quality with a reduced color mixing.

The cross-sectional structure shown in FIG. 3 is basically same also in other embodiments. Also FIG. 3 shows a case where the aperture of the light detecting element is defined by the light shielding film 10, but such structure is not restrictive. For example it may be defined by an area of a photodiode (the fact that the aperture of the light detecting element may be defined by the area of the photodiode being same in different embodiments).

Third Embodiment

Figure 5:
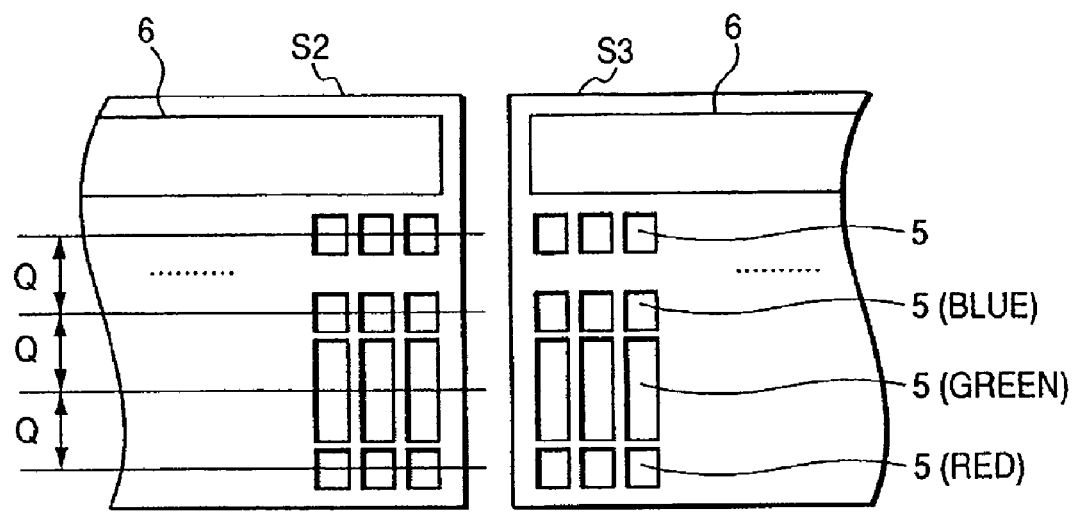
FIG. 5 is a schematic plan view of a third embodiment of the photoelectric converting device of the present invention.

FIG. 5 is a schematic plan view showing a configuration of a third embodiment of the present invention, and is a magnified view showing a boundary portion of two adjacent semiconductor image sensors. The structure of a multi-chip module type semiconductor image sensor will not be explained further, as it is already explained with reference to FIGS. 14 to 16. The present embodiment shows a case with four rows of light detecting elements having light detecting apertures. Recently, for improving the color reproducibility, there is proposed a configuration having, in addition to the prior red, green and blue light detecting parts, a light detecting part of intermediate spectral characteristics between green and blue. Also there is known another configuration having, in addition to the red, green and blue light detecting parts, a light detecting part for detecting an infrared light and executing an image correction by distinguishing an object of image capture and a dust on the object, utilizing whether the infrared light is transmitted or not. The third embodiment of the present invention is applicable to such cases, and provides effects similar to those of the first and second embodiments.

The present embodiment explains a case where a light detecting element row has a larger light detecting area and remaining light detecting element rows have a same light detecting area. Now, let us consider a case where, in the four light detecting element rows, the light detecting areas S1, S2, S3 and S4 of the light detecting elements have a relationship S1≧S2>S3≧S4. In such case, it is desirable to position the light detecting element rows with the light detecting elements of the areas S3 and S4 in both end rows, and not to position the light detecting element row with the light detecting element of the area S2, like the light detecting element row with the light detecting element of the area S1, in the end rows.

Fourth Embodiment

Figure 6:
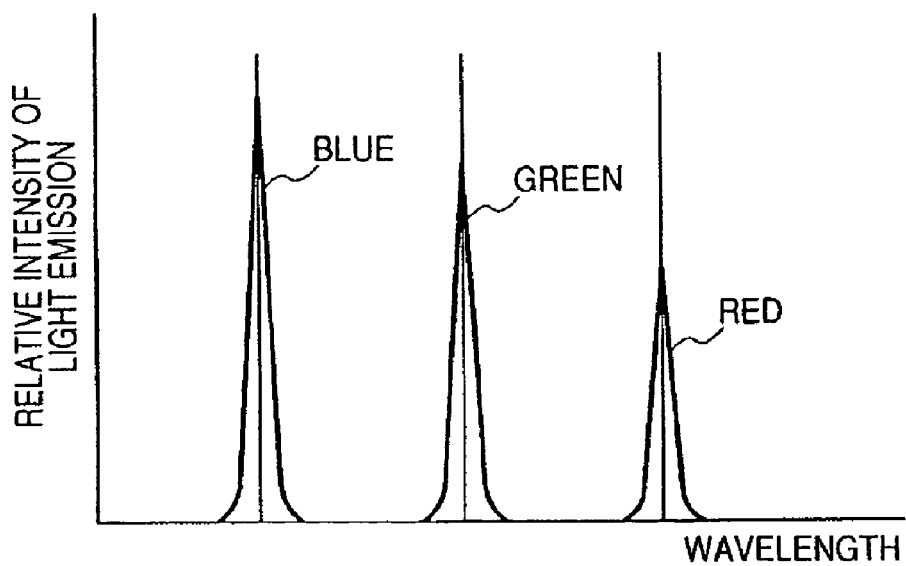
FIG. 6 is a spectral characteristic chart of an LED for explaining a fourth embodiment of the photoelectric converting device of the present invention.
Figure 7:
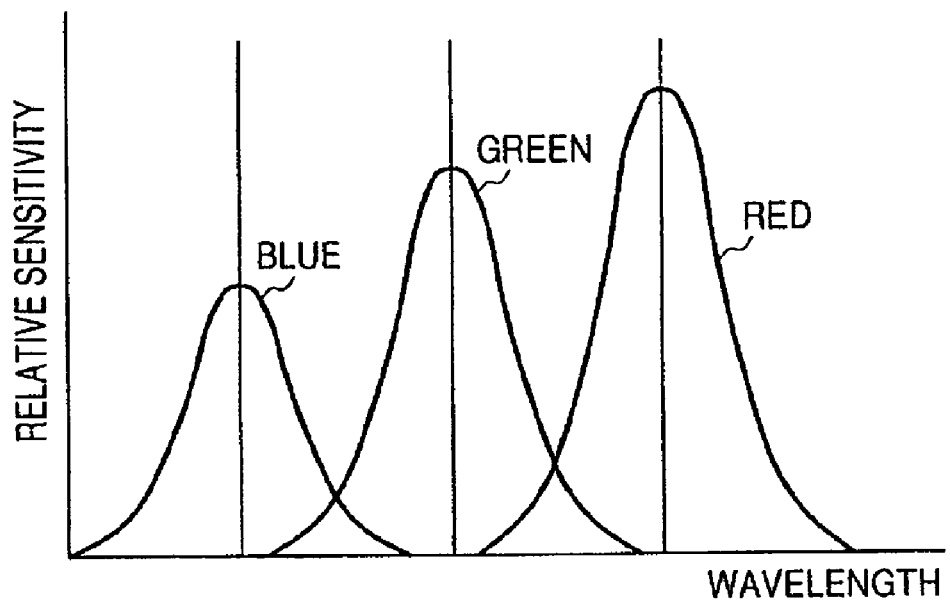
FIG. 7 is a spectral characteristic chart of a light detecting element for explaining the fourth embodiment of the photoelectric converting device of the present invention.
Figure 8:
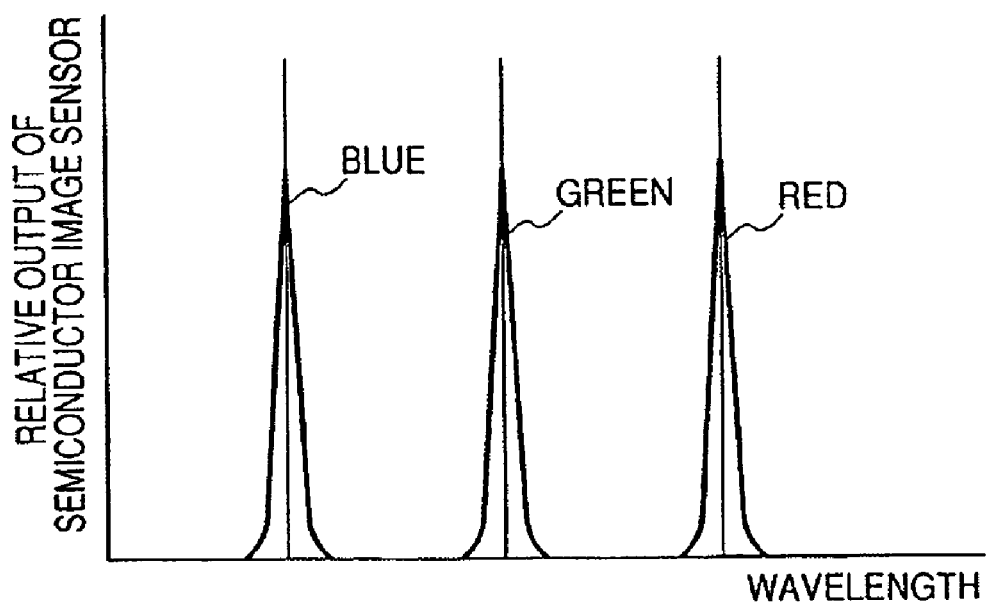
FIG. 8 is a spectral characteristic chart showing an output of a semiconductor image sensor for explaining the fourth embodiment of the photoelectric converting device of the present invention.

A fourth embodiment shows a case of utilizing three-color LEDs of red, green and blue as shown in FIG. 6, which shows the spectral characteristics thereof, with a wavelength in the abscissa and a relative light emission intensity on the ordinate. FIG. 7 shows spectral characteristics of the light detecting element, including the spectral characteristics of color filters, similarly with a wavelength in the abscissa and a relative sensitivity on the ordinate. Also FIG. 8 shows outputs of a semiconductor image sensor utilizing LEDs shown in FIG. 6 as the light source and utilizing light detecting elements of the spectral characteristics shown in FIG. 7 for image capture.

A wavelength selectivity is improved by employing LEDs of narrow light emission wavelength ranges as the light source, in addition to the color filters.

As already explained, an output level of the semiconductor image sensor is determined according to the light emission characteristics of LED, the spectral characteristics of the color filter and the spectral characteristics of the light detecting element. Therefore, in case the used LEDs have light emission intensities of blue>green>red as shown in FIG. 6, the areas of the light detecting apertures are so designed as to have sensitivity characteristics of blue<green<red as shown in FIG. 7, and a row with a largest aperture area is positioned in the central row thereby providing outputs well balanced among the colors of red, green and blue as shown in FIG. 8, while maintaining a constant row gap Q.

Fifth Embodiment

Figure 9:
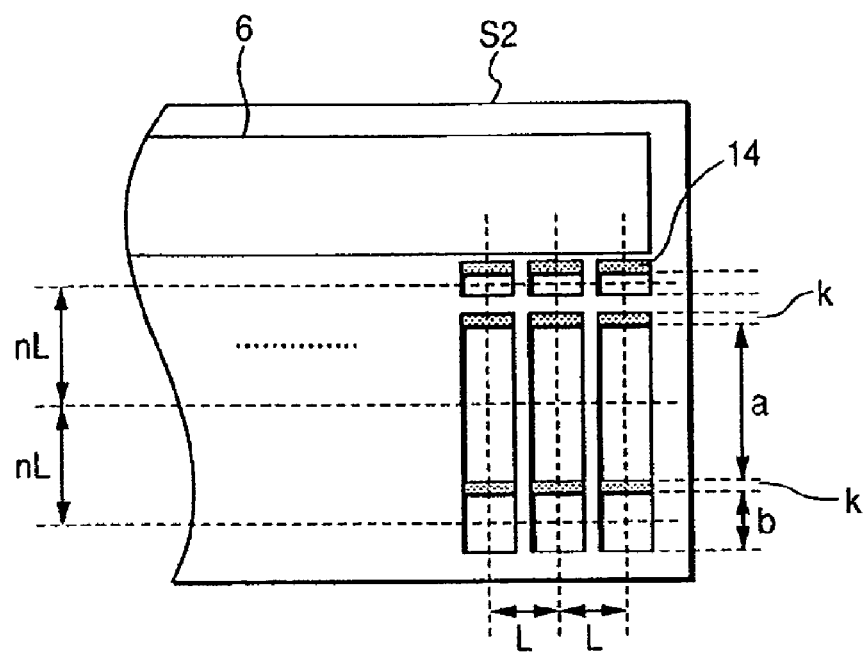
FIG. 9 is a schematic plan view of a fifth embodiment of the photoelectric converting device of the present invention.

FIG. 9 is a plan view of a fifth embodiment of the present invention. The structure of a multi-chip module type semiconductor image sensor will not be explained further, as it is already explained with reference to FIGS. 14 to 16. In FIG. 9, 14 indicates a drive circuit for fetching a photocharge generated in a light detecting element such as a photodiode. The drive circuit 14 is provided for example with a CCD (charge-coupled device) register and a CMOS source-follower amplifier, and serves to transfer a weak photocharge, generated in the light detecting element, to an output terminal and to amplify the charge.

Japanese Patent Application Laid-open No. H11-112006 discloses a configuration in which the drive circuit is constituted of a charge-voltage converting means (source-follower amplifier). Now following parameters are defined as shown in FIG. 9:

L: pitch of light detecting apertures in the main scanning direction (pitch of light detecting elements along the direction of array in a same light detecting element row);

nL: pitch of light detecting apertures in the sub scanning direction (pitch of the light detecting element rows in the direction of arrangement thereof) (n being a positive integer, 1, 2, 3, . . . );

k: width of the drive circuit portion in the direction of arrangement of the light detecting element rows;

a: width of a light detecting aperture of a largest area, in the direction of arrangement of the light detecting element rows;

b: width of a light detecting aperture of a second largest area, in the direction of arrangement of the light detecting element rows; and r (=a/b): an area ratio providing an optimum sensitivity balance.

The width a of the light detecting aperture with the largest area can assume a largest value when the following relationship is satisfied. Therefore the width a is preferably so selected as to satisfy or substantially satisfy the following relationship. In consideration of a possible fluctuation in the manufacture, the width a may be selected smaller than the value given by the relationship:

$$\frac{a}{2} + k + \frac{b}{2} = nL$$

This relationship can be rewritten as follows:

$$a = \frac{2r}{1+r}(nL - k)$$

For example, for N=2, k=0 and r=2, there is obtained:

$$a = \frac{8}{3}L$$

By setting the width of the light detecting aperture so as to meet the above-described relationship, a highest sensitivity can be realized while maintaining an optimum sensitivity ratio of the rows.

The present embodiment has been explained principally in a case where the color filters of red, green and blue are arranged in three rows, but such configuration is not restrictive. Also similar effects can be naturally obtained, with color filters of complementary colors, by the arrangement of the present invention.

Sixth Embodiment

Figure 12:
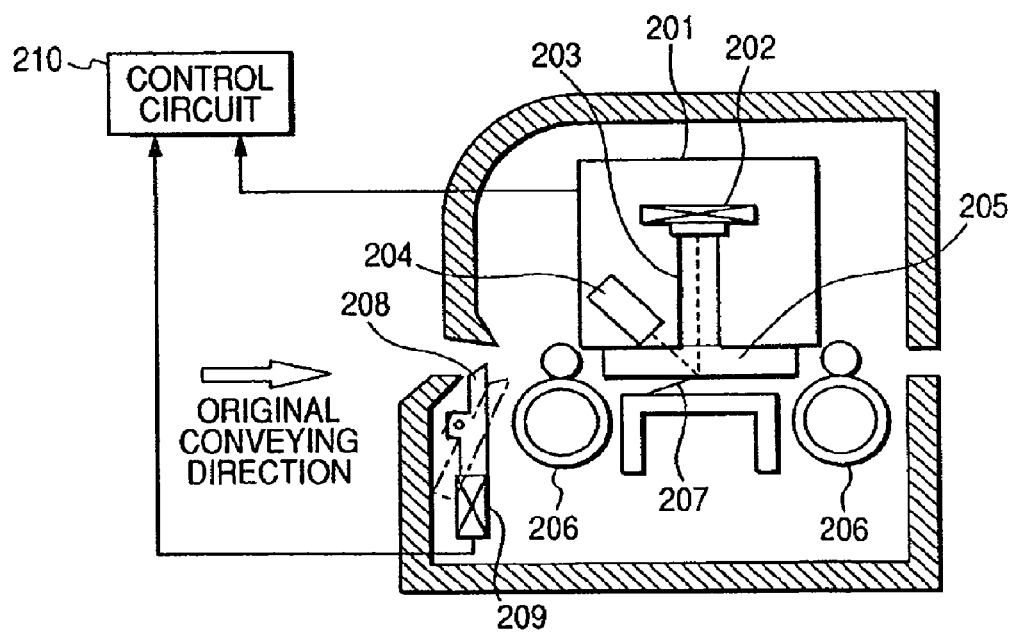
FIG. 12 is a schematic view of an original image reading apparatus for reading an original image.
Figure 13:
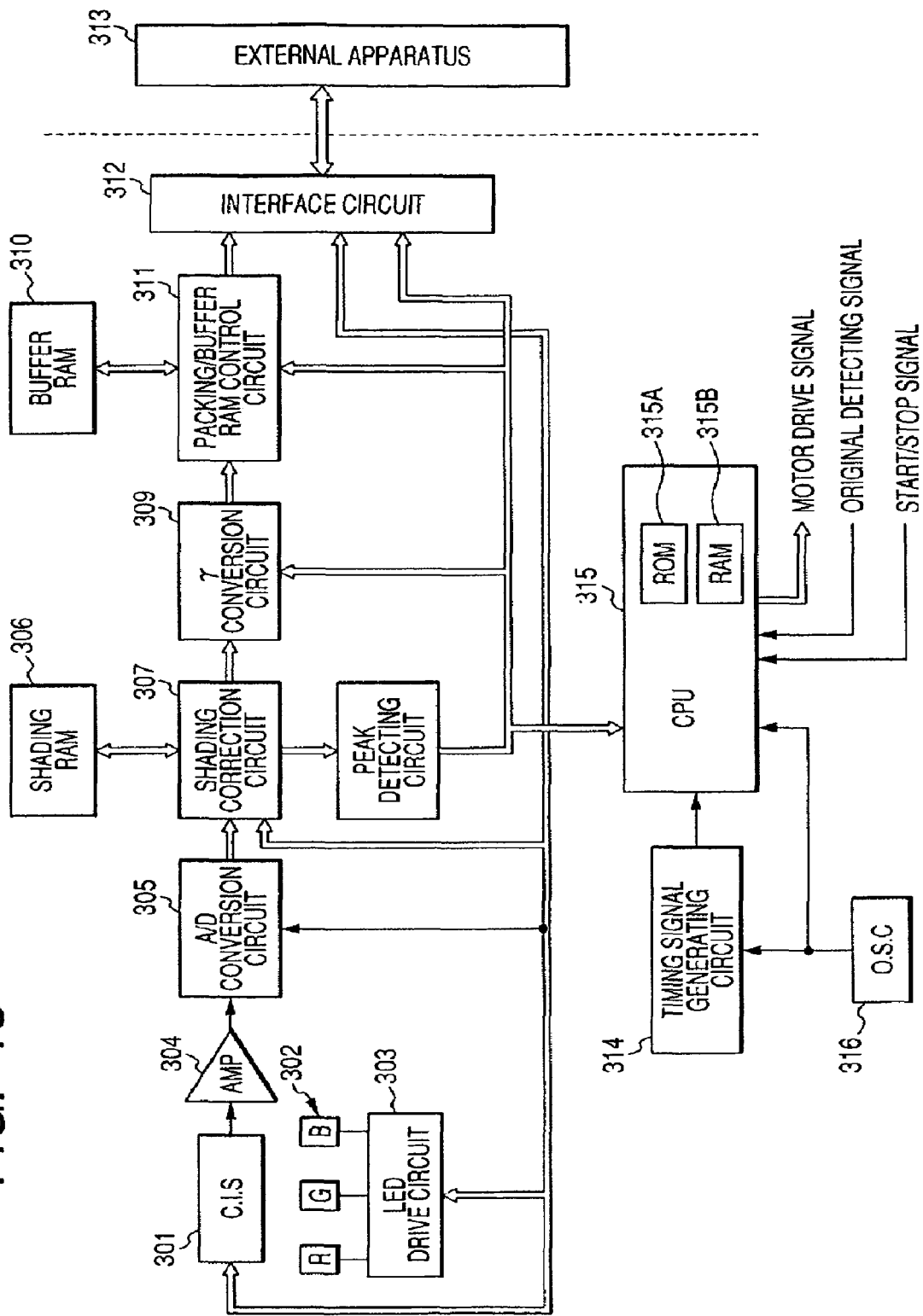
FIG. 13 is a block diagram showing a detailed electrical structure of a control circuit 210 in FIG. 12.

Now reference is made to FIGS. 12 and 13 for explaining an embodiment in which the multi-chip module type image sensor of the present invention is applied to an original image reading apparatus of sheet feeding type.

FIG. 12 is a schematic view of an original image reading apparatus for reading an original image.

A contact image sensor 201 (hereinafter also represented as CIS) is constituted of a multi-chip module type image sensor (photoelectric converting device) 202, a Celfoc lens 203, an LED array 204 and a contact glass 205.

Conveying rollers 206 are positioned in front of and behind the CIS 201, and are used for positioning an original. A contact sheet 207 is used for contacting the original with the CIS 1. A control circuit 210 processes signals from the CIS 201.

An original detecting lever 208 detects that an original is inserted. When an original is inserted, the original detecting lever 208 is inclined, thereby causing a change in the output thereof, and such state is transmitted to a CPU 315 (FIG. 13) in the control circuit 210 whereby an original insertion is identified. In response a driving motor (not shown) for the conveying rollers 206 is activated to start a conveying of the original and to execute a reading operation.

FIG. 13 is a block diagram showing a detailed electrical structure of the control circuit 210 shown in FIG. 12. Functions of the circuit will be explained in the following, with reference to FIG. 13.

In FIG. 13, a contact image sensor 301 (corresponding to CIS 201 in FIG. 12) is integrated with an LED 302 employed as the light source. A color image can be read by turning on an LED control (drive) circuit 303 while the original is conveyed on the contact glass 205 of the CIS 201 shown in FIG. 12.

An amplifier 304 amplifies the signal from the CIS 301, and an A/D converter 305 executes an A/D conversion on the amplified output to provide a digital output for example of 8 bits. A shading RAM 306 stores shading correction data by reading a calibration sheet in advance. A shading correction circuit 307 executes a shading correction on the read image signal, based on the data in the shading RAM 306. A peak detection circuit 308 detects a peak value in the read image data in each line, and is used for detecting a leading end of the original.

A gamma conversion circuit 309 executes a gamma conversion on the read image data, according to a gamma curve set in advance by a host computer.

A buffer RAM 310 is a random access memory for temporarily storing image data, in order to match the timing of the actual image reading operation with a communication with the host computer. A packing/buffer RAM control circuit 311 executes a data packing process according to an image output mode (such as binary, 4-bit multi-value, 8-bit multi-value or 24-bit multi-value) set in advance by the host computer. It also executes a process of writing such data thereafter in the buffer RAM 310, and a data output process of reading the image data from the buffer RAM 310 into an interface circuit 312.

An interface circuit 312 executes a control signal exchange with and an image signal output to an external apparatus, for example a personal computer, serving as a host apparatus of the image reading apparatus of the present embodiment.

A CPU 315, constituted for example of a microcomputer, is provided with a ROM 315A storing process programs and a working RAM 315B, and controls various parts according to the programs stored in the ROM 315A.

There are also provided a crystal oscillator 316, a timing signal generator 314 for generating various timing signals, to be used as references for operations, by a frequency division on the output of the oscillator 316 according to a setting by the CPU 315, and an external apparatus 313 such as a personal computer, connected with the control circuit through the interface circuit 312.

The present invention is applicable to an image sensor, or a multi-chip module type image sensor, a contact image sensor or an image reading apparatus formed by arranging plural image sensors in an array.

This application claims priority from Japanese Patent Application No. 2005-056018 filed Mar. 1, 2005, which is hereby incorporated by reference herein.

What is claimed is:

1. An image sensor comprising plural light detecting element rows each having plural light detecting elements and a color filter provided on each light detecting element, in which the light detecting element rows are arranged such that centers of gravity of light detecting parts of the light detecting elements in the respective light detecting element rows, are arranged at a constant pitch:

wherein a driving circuit part for reading an electrical signal from each light detecting element is provided for each light detecting element; and wherein a pitch L of the light detecting elements along a direction of array thereof in the plural light detecting element rows, a pitch nL (n being a positive integer) of the plural light detecting element rows in a direction of arrangement thereof, a width k of the driving circuit part along the direction of arrangement of the plural light detecting element rows, a width a of a first light detecting aperture with a largest area among the plural light detecting element rows along the direction of arrangement of the plural light detecting element rows, and a width b of a second light detecting aperture with a second largest area among the plural light detecting element rows along the direction of arrangement of the plural light detecting element rows are selected that the width a satisfies a following relation:

$(a/2)+k+(b/2)=nL$.

2. An image sensor according to claim 1, wherein light detecting elements in a same row have color filters of a same color, and color filters of different rows are of different colors row by row.

* * * * *